(12) United States Patent
Kanamaru et al.

(10) Patent No.: US 7,683,600 B2
(45) Date of Patent: Mar. 23, 2010

(54) OUTPUT CIRCUIT

(75) Inventors: Jiro Kanamaru, Kanagawa (JP);
Toshiaki Akioka, Kanagawa (JP)

(73) Assignee: NEC Electronics Corporation,
Kanagawa (JP)

( * ) Notice: Subject to any disclaimer, the term of this patent is extended or adjusted under 35 U.S.C. 154(b) by 139 days.

(21) Appl. No.: 12/104,063

(22) Filed: Apr. 16, 2008

(65) Prior Publication Data

US 2008/0258702 A1     Oct. 23, 2008

(30) Foreign Application Priority Data

Apr. 20, 2007     (JP)     ............... 2007-111958

(51) Int. Cl.
*G05F 3/16*     (2006.01)
(52) U.S. Cl. ...................... 323/315; 323/314
(58) Field of Classification Search ........... 323/304, 323/313, 314, 315
See application file for complete search history.

(56) References Cited

U.S. PATENT DOCUMENTS 7,440,249 B2 * 10/2008 Sheng et al. ............... 323/314

FOREIGN PATENT DOCUMENTS

JP     11346147     12/1999

* cited by examiner

*Primary Examiner*—Shawn Riley
(74) *Attorney, Agent, or Firm*—Sughrue Mion, PLLC

(57) ABSTRACT

An output circuit in accordance with one embodiment of the present invention includes: an input terminal for receiving an input signal; an output transistor connected between a first power supply and an output terminal; a current control circuit connected to the input terminal and the output transistor for controlling current outflow and inflow for the gate of the output transistor based on the input signal; a voltage generating circuit connected to the first power supply; and a switch circuit coupled between the gate of the output transistor and the voltage generating circuit, the switch circuit having alternatively an on state and an off state thereof in response to the input signal; wherein the switch circuit becomes the off state when the potential difference between the gate of the output transistor and the first power supply becomes equal to or below a predetermine value regardless of the voltage level of the input signal.

13 Claims, 9 Drawing Sheets

OUTPUT CIRCUIT

BACKGROUND OF THE INVENTION

1. Field of the Invention

The present invention relates to an output circuit, in particular, an output circuit capable of changing the voltage of an output terminal by the current inflow and outflow for the gate of an output transistor.

2. Description of Related Art

When a signal having sharp rising edges and falling edges is used in communications between different devices, the signal generates radiation noise and power-supply noise which may cause a malfunction in the system. To reduce these noises, it needs to decrease the slew rate of the rising edges and falling edges of the signal. Therefore, an output circuit for reducing the slew rate of an output signal with regard to the input signal has been proposed. These circuits are sometimes called slew rate circuits. Furthermore, in such circuits, the duty ratio of an output signal needs to be unchanged from the duty ratio of the input signal.

Japanese unexamined patent application publication No. 11-346147 (which is called "related art example" hereinafter) discloses an example of such circuits. FIG. 9 shows an output circuit 100 described in the related art example. The output circuit 100 controls the rising and falling of the gate voltage Vgate of an output transistor Qo by the current outputted from current sources Cs10, Cs11, Cs20, and Cs21. More specifically, when the gate voltage Vgate is changed from ground voltage to power supply voltage, both the current sources Cs10, Cs11 are used to increase the gate voltage Vgate until it reaches a certain voltage Vr1. Then, the current source Cs10 alone is used to increase the gate voltage Vgate after the gate voltage Vgate reaches the voltage Vr1. On the other hand, when the gate voltage Vgate is changed from power supply voltage to ground voltage, both the current sources Cs20, Cs21 are used to decrease the gate voltage Vgate until it reaches a certain voltage Vr2. Then, the current source Cs 20 alone is used to decrease the gate voltage Vgate after the gate voltage Vgate reaches the voltage Vr2.

As explained above, the output circuit 100 controls the transition time of the gate voltage Vgate by changing the number of current sources depending on the voltage value of the gate voltage Vgate. Using this control, the output circuit 100 makes the time difference between the rising edges of an input signal and an output signal substantially equal to the time difference between falling edges of the input signal and output signal. In this manner, the output circuit 100 reduces the slew rate of an output signal, and simultaneously enables substantially the same duty ratios between an input signal and an output signal.

However, the output circuit 100 controls the amount of current to the gate of an output transistor Qo depending on the gate voltage Vgate. Therefore, if noise gets into the output terminal, that noise is transmitted to the gate of the output transistor Qo through the parasitic capacitance between the drain and gate of the output transistor Qo. Then, the noise transmitted to the gate of the output transistor Qo may cause a malfunction in the comparators CP1 and CP2. That is, there is a problem that the output circuit 100 has low tolerance to noise transmitted from the output terminal.

SUMMARY

An output circuit in accordance with one embodiment of the present invention includes: an input terminal receiving an input signal; an output transistor connected between a first power supply and an output terminal; a current control circuit connected to the input terminal and the output transistor for controlling current outflow and inflow for the gate of the output transistor based on the input signal; a voltage generating circuit connected to the first power supply; and a switch circuit coupled between the gate of the output transistor and the voltage generating circuit, the switch circuit having alternatively an on state and an off state thereof in response to the input signal; wherein the switch circuit becomes the off state when the potential difference between the gate of the output transistor and the first power supply becomes equal to or below a predetermine value regardless of the voltage level of the input signal.

The output circuit in accordance with one embodiment of the present invention, the gate voltage of an output transistor is controlled by a current control circuit and a switch circuit both of which are controlled based on the input signal inputted from the input terminal. In this manner, the outflow and inflow for the gate of the output transistor is not affected by noise transmitted from the output terminal.

The output circuit in accordance with one embodiment of the present invention can improve tolerance to noise mixed from the output terminal.

BRIEF DESCRIPTION OF THE DRAWINGS

The above and other objects, advantages and features of the present invention will be more apparent from following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
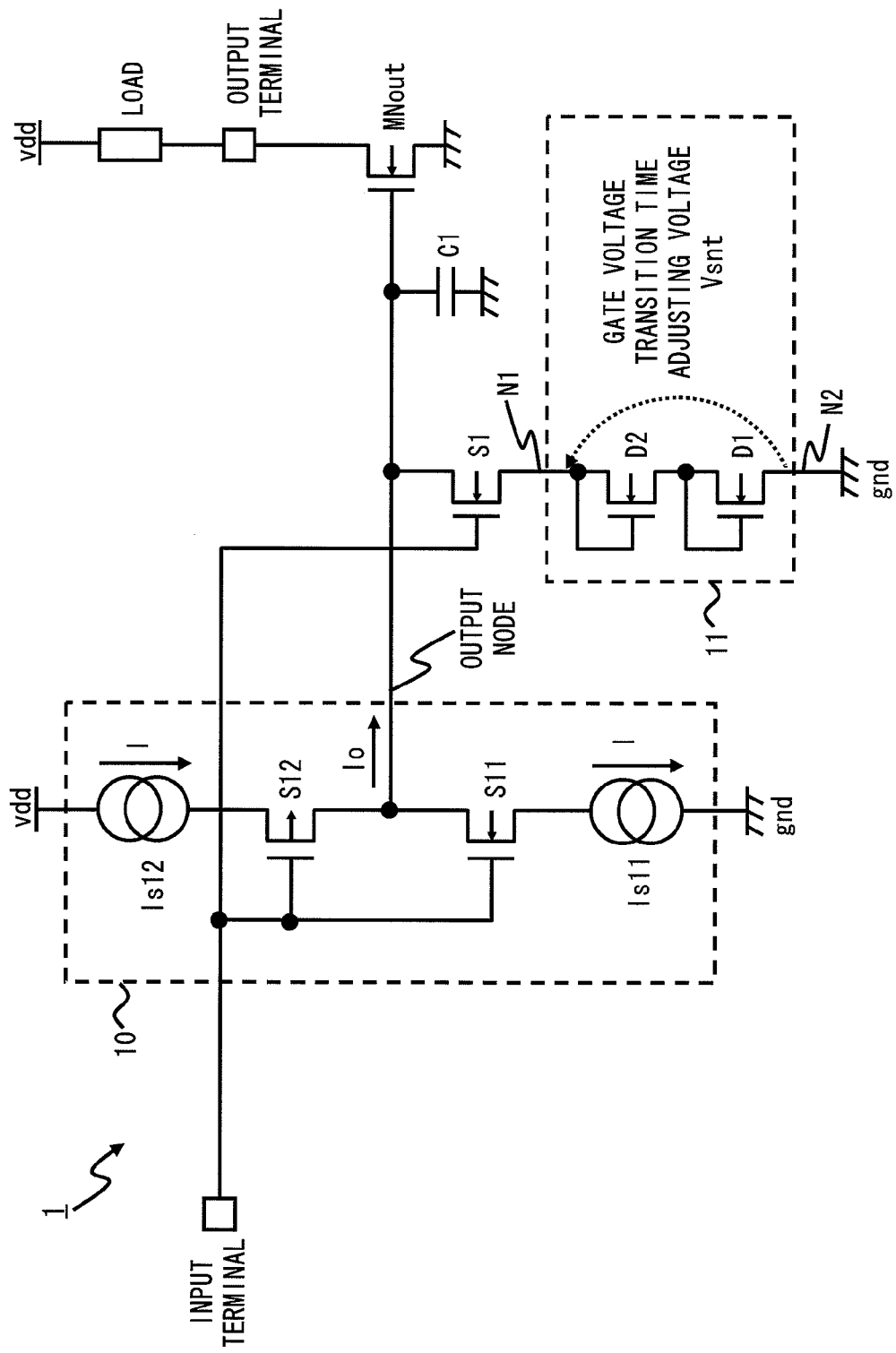
FIG. 1 is a circuit diagram of an output circuit in accordance with a first embodiment of the present invention.

FIG. 1 shows a block diagram of an output circuit 1 in accordance with a first embodiment of the present invention. As shown in FIG. 1, the output circuit 1 includes an input terminal, an output terminal, an output transistor MNout, a current control circuit 10, a switch circuit S1, a voltage generating circuit 11, and a capacitor C1.

The output transistor MNout is connected between the output terminal and a first power supply (e.g., ground wiring "gnd"). In this embodiment, the output transistor MNout is a NMOS transistor, and the source is connected to the ground wiring gnd and the drain is connected to the output terminal. Furthermore, a load is connected between the output terminal and a second power supply (e.g., power supply wiring "vdd").

Incidentally, an output terminal voltage transition range is defined as the gate voltage range of the output transistor. The output terminal voltage transition range is established based on the threshold voltage and transconductance gm of the output transistor. When the gate voltage is in this output terminal voltage transition range, the voltage of the output terminal falls between High level (e.g., power supply voltage VDD) and Low level (e.g., ground voltage GND). In the following explanation, the voltage value on a high-voltage side in the output terminal voltage transition range is called "upper range value VH", and the voltage value on a low-voltage side is called "lower range value VL" When a NMOS transistor is used as the output transistor, the threshold voltage of the output transistor is defined as the lower range value VL.

The current control circuit 10, which is connected to the input terminal and output transistor MNout, controls the current inflow or outflow for the gate of the output transistor MNout. The current control circuit 10 includes a first current source Is11, a second current source Is12, a first current control switch S11, and a second current control switch S12. In this embodiment, both the first and second current sources output current having current value I. The first current source Is11 and first current control switch S11 are connected in series between the gate of the output transistor MNout and the ground wiring gnd. The second current source Is12 and second current control switch S12 are connected in series between the gate of the output transistor MNout and the power supply wiring vdd.

In this embodiment, the first current control switch S11 is a NMOS transistor. The source, drain, and gate of this NMOS transistor are connected to the first current source, the gate of output transistor MNout, and the input terminal respectively. The conductivity of this NMOS transistor is controlled based on the input signal inputted from the input terminal. Furthermore, the second current control switch S12 is a PMOS transistor. The source, drain, and gate of this PMOS transistor are connected to the second current source, the gate of output transistor MNout, and the input terminal respectively. The conductivity of this PMOS transistor is controlled based on the input signal inputted from the input terminal. Incidentally, the first current control switch S11 may be connected between the first current source Is11 and the ground wiring gnd, and second current control switch S12 may be connected between the second current source Is12 and the power supply wiring vdd.

The switch circuit S1 is connected between the gate of the output transistor MNout and the voltage generating circuit 11. The open/close state of the switch circuit S1 is controlled based on the input signal inputted from the input terminal. In this embodiment, the switch circuit S1 is a NMON transistor. The source, drain, and gate of this NMOS transistor are connected to the input terminal, the voltage generating circuit 11, and the gate of output transistor MNout respectively. The switch circuit S1 has an "on" state and an "off" state. In the following explanation, the on state means a state in which current is flowing through the switch circuit S1, and the off state means a state in which current is not flowing through the switch circuit S1, regardless of the open/close state (or conductivity) of the switch circuit S1. Furthermore, the open-state of the open/close state means a state in which current is cut off, and the close-state means a state in which current can flow.

The voltage generating circuit 11 is connected to the ground wiring gnd. More specifically, a first node N1 of the voltage generating circuit 11 is connected to the output transistor MNout through the switch circuit S1, a second node N2 is connected to the ground wiring gnd. The voltage generating circuit 11 includes a plurality of diodes D1 and D2 connected in series between the first node N1 and second node N2. Each diode D1 and D2 is connected in such manner that the anode is placed on the side of the node N1 and the cathode is placed on the side of the second node N2. In this embodiment, diode-connected NMOS transistors are used for these diodes. In this case, the drain and gate of the NMOS transistor are connected with each other, and the drain and source are used as an anode and a cathode respectively. Furthermore, the voltage generating circuit 11 generates a predetermined voltage (which is called "gate voltage transition time adjusting voltage Vsnt" hereinafter) depending on the number of diodes connected in series.

Incidentally, the voltage generating circuit 11 may be constructed differently provided that it flows current from the first node N1 toward the second node N2 when the voltage difference between the first node N1 and second node N2 is equal to or larger than the gate voltage transition time adjusting voltage Vsnt, and cuts off current from the first node N1 toward the second node N2 when the voltage difference between the first node N1 and second node N2 is smaller than the gate voltage transition time adjusting voltage Vsnt. Furthermore, in a different perspective, the voltage generating circuit 11 may be constructed differently provided that it reduces the impedance of the first node N1 to a low impedance state (preferably, to such extent that the first node N1 and second node N2 are substantially shorted) when the voltage difference between the first node N1 and second node N2 is equal to or larger than the gate voltage transition time adjusting voltage Vsnt, and it increases the impedance of the first node N1 to a high impedance state (preferably, to such extent that the first node N1 and second node N2 are substantially insulated) when the voltage difference between the first node N1 and second node N2 is smaller than the gate voltage transition time adjusting voltage Vsnt. That is, all that is required of the voltage generating circuit 11 is to bring the current path from first node N1 to the second node N2 to a conductivity state when the voltage difference between the first node N1 and second node N2 is equal to or larger than the gate voltage transition time adjusting voltage Vsnt. Therefore, although a plurality of serially connected diodes are used as the voltage generating circuit 11 in this embodiment, other circuits are usable for the voltage generating circuit 11. Furthermore, either the switch circuit S1 or voltage generating circuit 11 can be connected to the ground wiring provided that both circuits are connected in series with each other.

When a NMOS transistor is used as a output transistor, the total value of the threshold voltage of the output transistor, a output terminal voltage transition range, and a first voltage range which is a voltage range higher than the upper range value VH of the output terminal voltage transition range (which is called "delay setting voltage range" hereinafter) is defined as a gate voltage transition time adjusting voltage Vsnt. At this point, the delay setting voltage range has preferably the same value as the threshold value of the output transistor. Although the gate voltage transition time adjusting voltage Vsnt is generated with two diodes in this embodiment, the number of the serially connected diodes may be varied depending on the characteristics of the output transistor.

A capacitor C1 is connected between the gate of the output transistor MNout and the ground wiring gnd. The gradient of the gate voltage change of the output transistor MNout is determined by the capacitance of the capacitor C1 and the output current value of the current control circuit 10. The capacitance of the capacitor C1 is preferably ten times as large as or larger than the parasitic gate capacitance of the output transistor MNout so that the parasitic gate capacitance of the output transistor MNout does not affect the establishment of this gradient.

Figure 2:
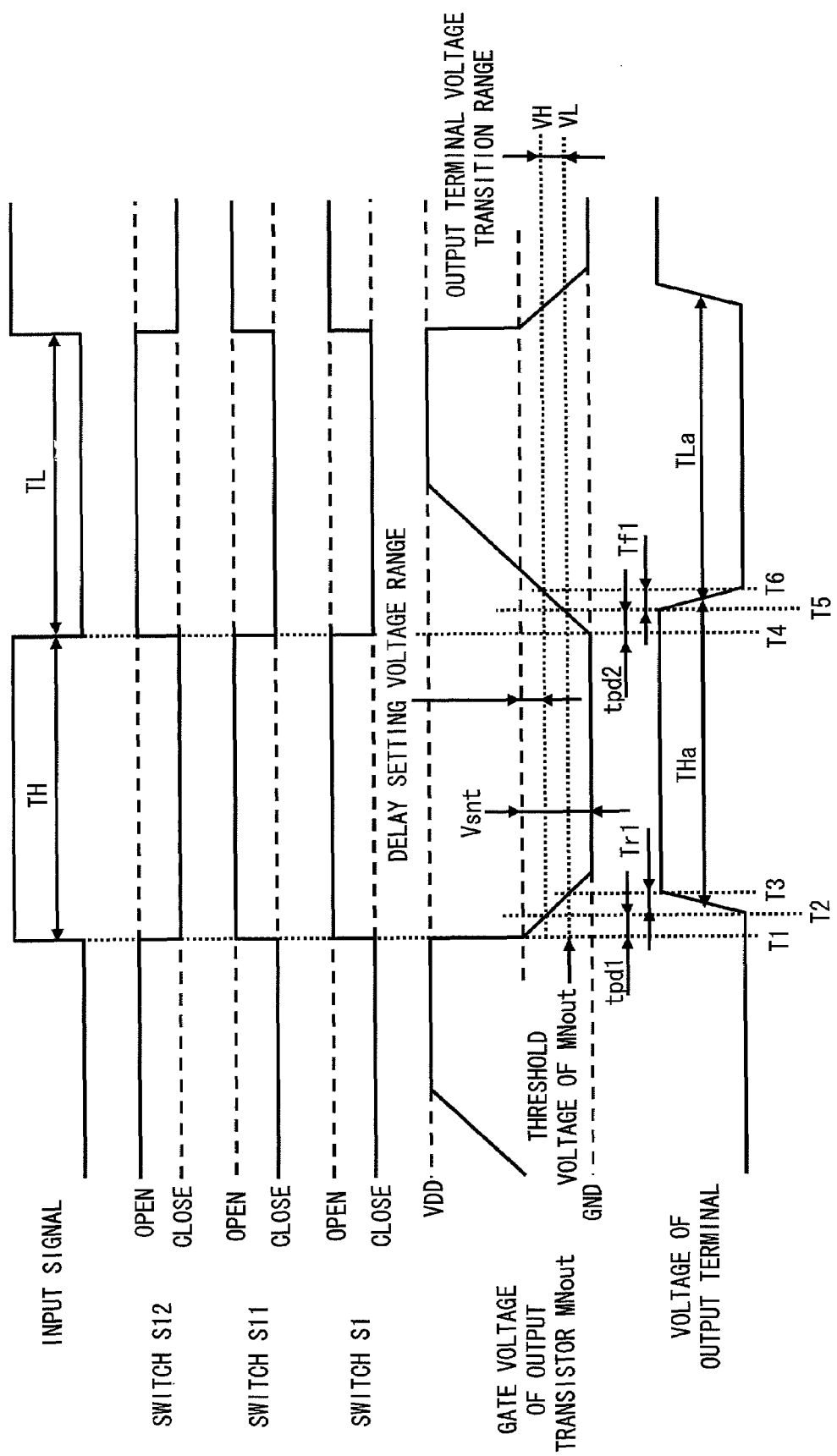
FIG. 2 is a timing chart showing the operation of the output circuit in accordance with the first embodiment of the present invention.

Next, the timing chart of the operation of the output circuit 1 is show in FIG. 2. The operation of the output circuit 1 is explained hereinafter with reference to FIG. 2. An input signal is inputted to the output circuit 1 from the input terminal. This input signal has High level periods TH and Low level periods TL. Therefore, the duty ratio D of the input signal is expressed by the equation D=TH/TL.

The input signal changes from Low level to High level at timing T1. In response to this rising of the input signal, the first current control switch S11 turns to the close-state, and the second current control switch S12 turns to the open-state. In this manner, the current control circuit 10 establishes the current generated at the first current source Is11 as the output current Io. Therefore, at this point, the output current has an inflow direction and current value I.

Furthermore, the switch circuit S1 tunes to the close-state at the timing T1. Furthermore, since the switch circuit S1 tunes to the close-state, the power supply voltage VDD, which was the gate voltage of the output transistor MNout before the timing T1, is applied to the first node N1 of the voltage generating circuit 11. In this manner, the switch circuit S1 tunes to the on state allowing a current flow, and the voltage generating circuit 11 draws in the charge accumulated in the capacitor C1 and the parasitic gate capacitance of the output transistor MNout and lowers the gate voltage of the output transistor MNout until the voltage difference between the first node N1 and second node N2 reaches the gate voltage transition time adjusting voltage Vsnt. In this embodiment, since the second node N2 is connected to the ground wiring gnd, the gate voltage of the output transistor MNout becomes the gate voltage transition time adjusting voltage Vsnt when the voltage difference between the first node N1 and second node N2 reaches the gate voltage transition time adjusting voltage Vsnt.

Incidentally, the voltage generating circuit 11 brings the connection between the first node N1 and second node N2 to a low impedance state when the voltage difference between these nodes is equal to or larger than the gate voltage transition time adjusting voltage Vsnt. Therefore, the gradient of the gate voltage change in this inflow operation is sharper than the gradient of the gate voltage change determined by the output current value Io of the current control circuit 10 and the capacitor C1. That is, as shown in FIG. 2, the gate voltage of the output transistor MNout reaches the falling gate voltage transition time adjusting voltage Vsnt almost simultaneously with the rising edge of the input signal at the timing T1 with this inflow operation.

After the voltage difference between the first node N1 and second node N2 of the voltage generating circuit 11 reaches gate voltage transition time adjusting voltage Vsnt, the voltage differences between the anodes and cathodes of the diodes D1 and D2 become lower than the operating voltage of the diodes as the gate voltage of the output transistor MNout further decreases. Therefore, the voltage generating circuit 11 brings the first node N1 to a high impedance state, and cuts off the current flowing from the first node N1 to second node N2.

In this manner, the first node N1 and second node N2 become substantially insulated from each other. Furthermore, although the switch circuit S1 remains in the close-state, it becomes the off state, in which current is not flowing between the source and drain of the switch circuit S1, since the voltage generating circuit 11 cuts off the current path from the drain of the switch circuit S1 to the ground wiring gnd.

After the gate voltage of the output transistor MNout reaches gate voltage transition time adjusting voltage Vsnt by the operation of the voltage generating circuit 11 and switch circuit S1, the gate voltage of the output transistor MNout decreases in the gradient determined by the output current Io of the current control circuit 10 and the capacitor C1. This gradient is expressed by the equation (1) shown below wherein VG1 is the gate voltage of the output transistor MNout, Io is the output current value of the current control circuit 10 (which is −I when the first current control switch S11 is in the close-state), C1 is the capacitance of the capacitor C1, and t is the elapsed time since the first current control switch S11 becomes the close-state. Incidentally, in this embodiment, since the capacitance of the capacitor C1 is much larger than the parasitic gate capacitance of the output transistor MNout, the component derived from the parasitic gate capacitance of the output transistor MNout is omitted.

$$VG1=(Io/C1)\times t=(-I/C1)\times t \qquad (1)$$

Next, when the gate voltage of the output transistor MNout further decreases and reaches the upper range value VH of the output terminal voltage transition range at timing T2, the voltage of the output terminal starts to increase. Then, when the gate voltage of the output transistor MNout reaches the lower range value VL of the output terminal voltage transition range at timing T3, the voltage of the output terminal turns to High level, and the voltage change of the output terminal is completed. That is, the voltage of the output terminal remains unchanged over the period from the timing T1 to the timing T2, and changes over the period from the timing T2 to the timing T3. The period from the timing T1 to the timing T2 is defined as the delay time Tpd1 between the output signal and the input signal. Meanwhile, the period from the timing T2 to the timing T3 is defined as a rising time Tr1 of the output signal.

Next, the input signal falls at timing T4. In response to this falling edge of the input signal, the first current control switch S11 turns to the open-state, and the second current control switch S12 turns to the close-state. In this manner, the current control circuit 10 establishes the current generated at the second current source Is12 as the output current Io. Therefore, at this point, the output current has an outflow direction and current value I.

Furthermore, the switch circuit S1 tunes to the open-state at the timing T4. In this manner, voltage generating circuit 11 is cut off from the gate of output transistor MNout. Therefore, after the timing T4, the gate voltage of the output transistor MNout increases in the gradient determined by the output current Io of the current control circuit 10 and the capacitor C1 until the gate voltage of the output transistor MNout reaches the power supply voltage VDD. This gradient is expressed by the equation (2) shown below wherein VG2 is the gate voltage of the output transistor MNout, Io is the output current value of the current control circuit 10 (which is I when the second current control switch S12 is in the close-state), C1 is the capacitance of the capacitor C1, and t is the elapsed time since the second current control switch S12 becomes the close-state.

$$VG2=(Io/C1)\times t=(I/C1)\times t \qquad (2)$$

When the gate voltage of the output transistor MNout reaches the lower range value VL of the output terminal voltage transition range at timing T5, the voltage of the output terminal starts to change. Then, when the gate voltage of the output transistor MNout reaches the upper range value VH of the output terminal voltage transition range at timing T6, the voltage of the output terminal turns to Low level, and the voltage change of the output terminal is completed. That is, the voltage of the output terminal remains unchanged over the period from the timing T4 to the timing T4, and changes over the period from the timing T5 to the timing T6. The period from the timing T4 to the timing T5 is defined as the delay time Tpd2 between the output signal and the input signal. Meanwhile, the period from the timing T5 to the timing T6 is defined as a rising time Tf1 of the output signal.

As explained above, the output circuit 1 controls the current control circuit 10 and the switch circuit S1, which are used to control the gate voltage of the output transistor MNout, based on the input signal from the input terminal. In this manner, even if noise is transmitted from the output terminal in the output circuit 1, the noise does not affect the operation of the current control circuit 10 and switch circuit S1. That is, an output circuit 1 in accordance with this embodiment can improve tolerance to noise transmitted from the output terminal.

Furthermore, in the output circuit 1, both the rising and falling gradients of the gate voltage of the output transistor are determined by the capacitance of the capacitor C1 and the output current Io which has the same absolute value, and the delay setting voltage range at the gate voltage transition time adjusting voltage Vsnt is established to the same value as the threshold voltage of the output transistor. Furthermore, the output circuit 1 controls the timing of the falling edge of the gate voltage of the output transistor MNout by the voltage generating circuit 11 and switch circuit S1. In this manner, the output circuit 1 makes the delay times Tpd1 and Tpd2 equal to each other over the voltage change of the output terminal (which is called "output signal" hereinafter). The output circuit 1 also makes the rising time Tr1 and falling time Tf1 equal to each other over the output signal change. That is, the output circuit 1 makes the High level period THa and Low level period TLa in the output signal equal to the High level period TH and Low level period TL respectively in the input signal. The output circuit 1 makes the duty ratio of an output signal equal to the duty ratio of the input signal by achieving these input-output characteristics. That is, the output circuit 1 makes the duty ratio of an output signal precisely conform to the duty ratio of the input signal.

Furthermore, the output circuit 1 includes the voltage generating circuit 11 and the switch circuit S1, both of which have simple structure, for controlling the falling timing of the gate voltage of the output transistor MNout. More specifically, the voltage generating circuit 11 is composed of two diode-connected NMOS transistors, and the switch circuit is composed of only one NMOS transistor. That is, the output circuit 1 in accordance with this embodiment can improve accuracy of the duty ration of an output signal with respect to the duty ratio of the input signal, as well as tolerance to noise mixed from the output terminal by simple structure.

Second Embodiment

Figure 3:
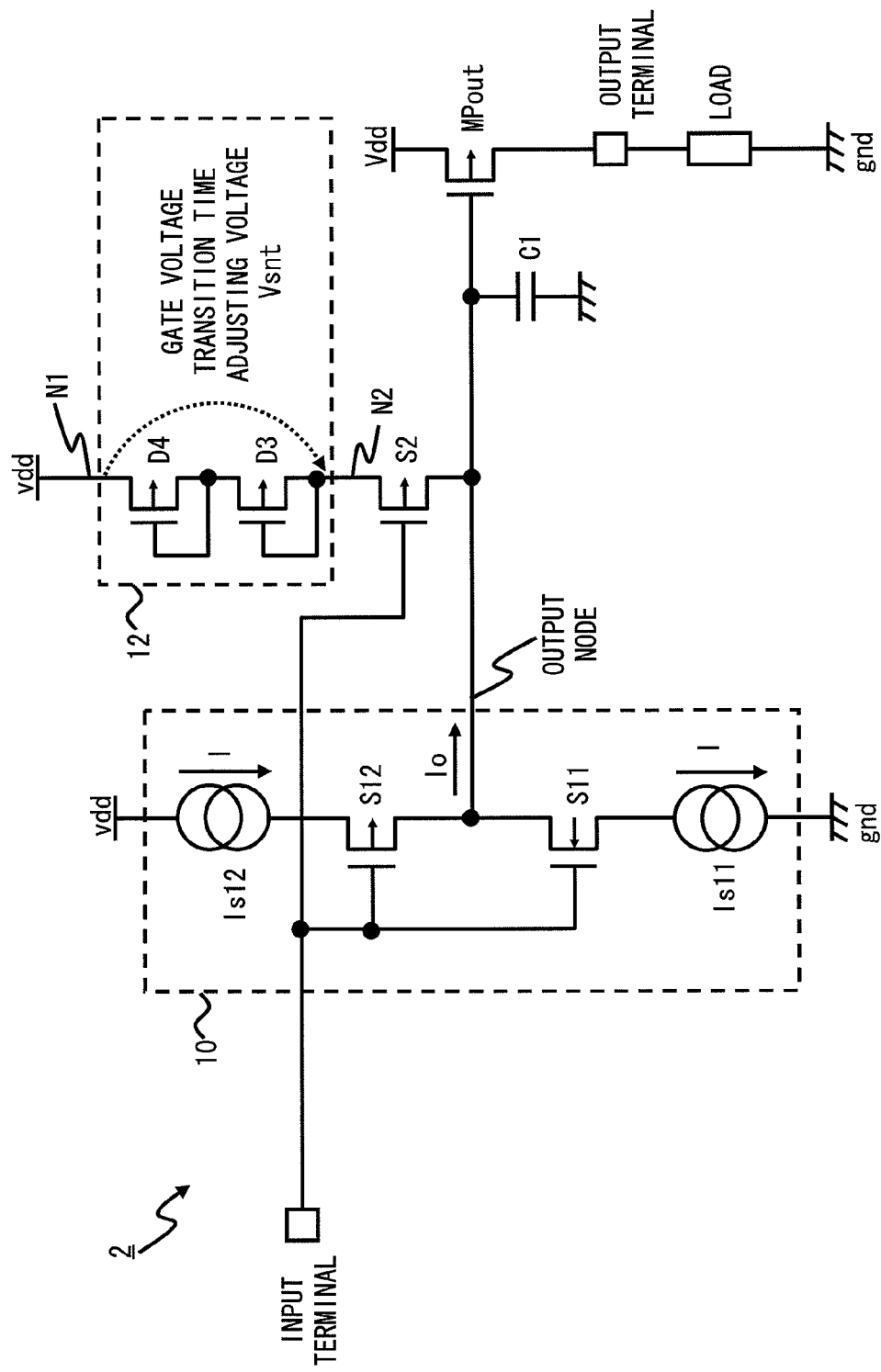
FIG. 3 is a circuit diagram of an output circuit in accordance with a second embodiment of the present invention.

FIG. 3 shows a circuit diagram of an output circuit in accordance with a second embodiment of the present invention. As shown in FIG. 3, the output circuit 2 uses a PMOS transistor (which is called "output transistor MPout" hereinafter) as the output transistor in the output circuit 1 of the first embodiment. In the output circuit 2, diodes D3 and D4 of a voltage generating circuit 12 and a switch circuit S2 are composed of PMOS transistors in accordance with the polarity of the output transistor MPout in the output circuit 2. Incidentally, the voltage generating circuit 12 and switch circuit S2 correspond to the voltage generating circuit 11 and switch circuit S1 respectively of the output circuit 1. Furthermore, a first power supply and a second power supply are power supply wiring vdd and ground wiring gnd respectively in the second embodiment.

Furthermore, an output terminal voltage transition range and gate voltage transition time adjusting voltage Vsnt are also defined in the second embodiment. In the second embodiment, the threshold of the output transistor MPout is used as the upper range value VH of the output terminal voltage transition range. Furthermore, the lower range value VL is established at a certain value based on the same reason as for the upper range value VH of the first embodiment. Although the gate voltage transition time adjusting voltage Vsnt has a delay time setting range in the same way as in the first embodiment, the delay time setting range is established as the lower value of the lower range value VL of the output terminal voltage transition range in the second embodiment.

Figure 4:
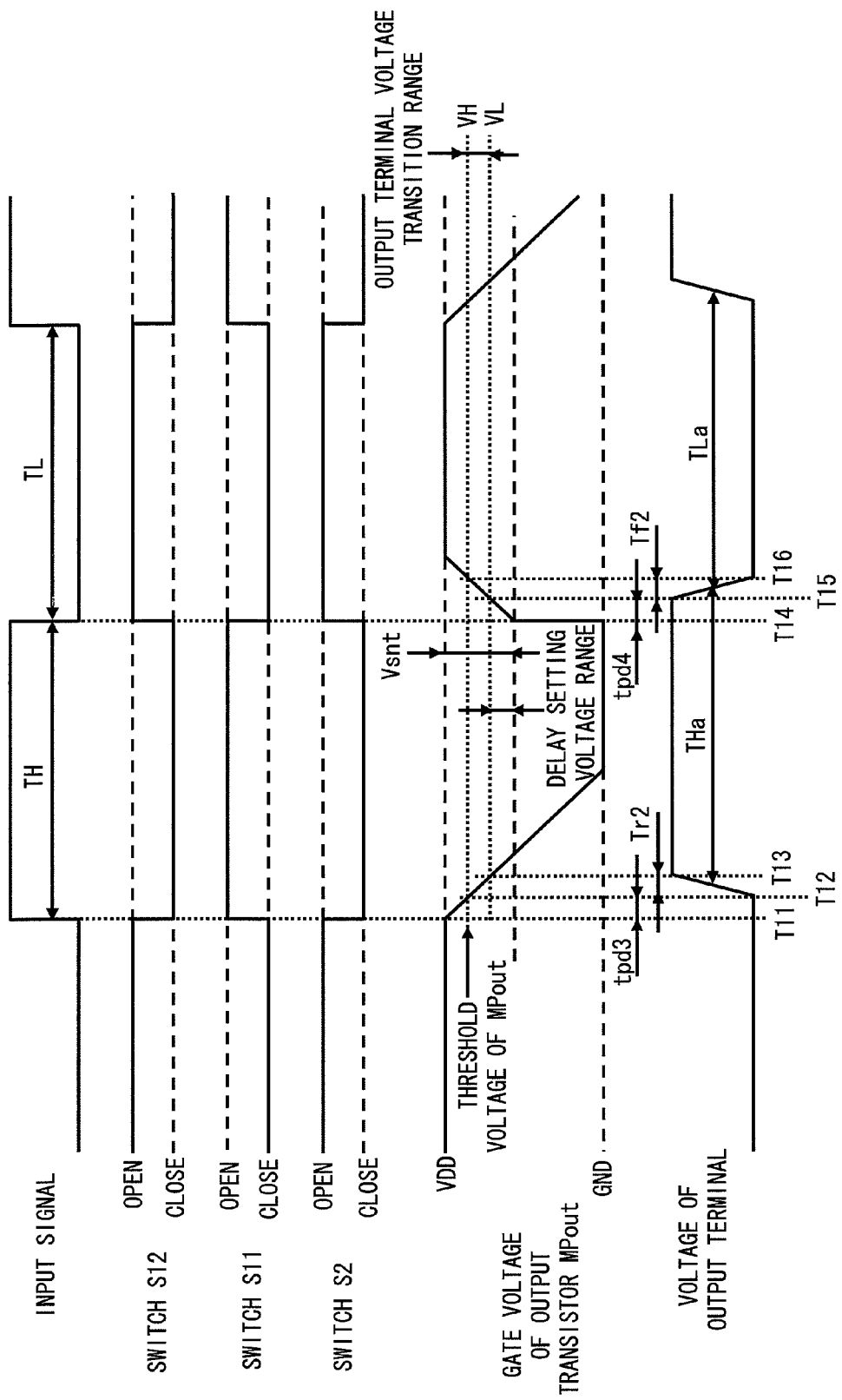
FIG. 4 is a timing chart showing the operation of the output circuit in accordance with the second embodiment of the present invention.

Next, the timing chart of the operation of the output circuit 2 is shown in FIG. 4, and the operation of the output circuit 2 is explained hereinafter with reference to FIG. 4. Firstly, the input signal rises at timing T11. In response to this rising edge of the input signal, the first current control switch S11 turns to the close-state, and the second current control switch S12 turns to the open-state. In this manner, the current control circuit 10 establishes the current generated at the first current source Is11 as the output current Io. Therefore, at this point, the output current has an inflow direction and current value I.

Furthermore, the switch circuit S2 tunes to the open-state at the timing T11. In this manner, voltage generating circuit 12 is cut off from the gate of the output transistor MPout. Therefore, after the timing T11, the gate voltage of the output transistor MPout decreases in the gradient determined by the output current Io of the current control circuit 10 and the capacitor C1 until the gate voltage of the output transistor MPout reaches the ground voltage GND. This gradient is expressed by the equation (3) shown below wherein VG3 is the gate voltage of the output transistor MPout, Io is the output current value of the current control circuit 10 (which is −I when the first current control switch S11 is in the close-state), C1 is the capacitance of the capacitor C1, and t is the elapsed time since the first current control switch S11 becomes the close-state.

$$VG3=(Io/C1)\times t=(-I/C1)\times t \quad (3)$$

When the gate voltage of the output transistor MPout reaches the upper range value VH of the output terminal voltage transition range at timing T12, the voltage of the output terminal starts to change. Then, when the gate voltage of the output transistor MPout reaches the lower range value VL of the output terminal voltage transition range at timing T13, the voltage of the output terminal turns to High level, and the voltage change of the output terminal is completed. That is, the voltage of the output terminal remains unchanged over the period from the timing T11 to the timing T12, and changes over the period from the timing T12 to the timing T13. The period from the timing T11 to the timing T12 is defined as the delay time Tpd3 between the output signal and the input signal. Meanwhile, the period from the timing T12 to the timing T13 is defined as a rising time Tr2 of the output signal.

Next, the input signal changes from High level to Low level at timing T14. In response to this falling edge of the input signal, the first current control switch S11 turns to the open-state, and the second current control switch S12 turns to the close-state. In this manner, the current control circuit 10 establishes the current generated at the second current source Is12 as the output current Io. Therefore, at this point, the output current has an outflow direction and current value I.

Furthermore, the switch circuit S2 tunes to the close-state at the timing T14. Furthermore, since the switch circuit S2 tunes to the close-state, the ground voltage GND, which was the gate voltage of the output transistor MPout before the timing T14, is applied to the first node N1 of the voltage generating circuit 12. In this manner, the switch circuit S2 tunes to the on state allowing a current flow, and the voltage generating circuit 11 pours out current to the capacitor C1 and raises the gate voltage of the output transistor MPout until the voltage difference between the first node N1 and second node N2 reaches the gate voltage transition time adjusting voltage Vsnt. In this embodiment, since the second node N2 is connected to the power supply wiring vdd, the gate voltage of the output transistor MPout becomes the VDD-Vsnt when the voltage difference between the first node N1 and second node N2 reaches the gate voltage transition time adjusting voltage Vsnt.

Incidentally, the voltage generating circuit 12 brings the connection between the first node N1 and second node N2 to a low impedance state when the voltage difference between these nodes is equal to or smaller than the gate voltage transition time adjusting voltage Vsnt. Therefore, the gradient of the gate voltage change in this outflow operation is sharper than the gradient of the gate voltage change determined by the output current value Io of the current control circuit 10 and the capacitor C1. That is, as shown in FIG. 4, the gate voltage of the output transistor MPout reaches the falling VDD-Vsnt almost simultaneously with the falling edge of the input signal at the timing T14 with this outflow operation.

After the voltage difference between the first node N1 and second node N2 of the voltage generating circuit 12 reaches gate voltage transition time adjusting voltage Vsnt, the voltage differences between the anodes and cathodes of the diodes D1 and D2 become lower than the operating voltage of the diodes as the gate voltage of the output transistor MPout further increases. Therefore, the voltage generating circuit 12 brings the first node N1 to a high impedance state, and cuts off the current flowing from the first node N1 to second node N2. In this manner, the first node N1 and second node N2 become substantially insulated from each other. Furthermore, although the switch circuit S2 remains in the close-state, it becomes the off state in which current is not flowing between the source and drain of the switch circuit S2 since the voltage generating circuit 12 cuts off the current path from the power supply wiring vdd to the drain of the switch circuit S2.

After the gate voltage of the output transistor MPout reaches VDD-Vsnt by the operation of the voltage generating circuit 12 and switch circuit S2, the gate voltage of the output transistor MPout increases in the gradient determined by the output current Io of the current control circuit 10 and the capacitor C1. This gradient is expressed by the equation (4) shown below wherein VG4 is the gate voltage of the output transistor MPout, Io is the output current value of the current control circuit 10 (which is I when the second current control switch S12 is in the close-state), C1 is the capacitance of the capacitor C1, and t is the elapsed time since the second current control switch S12 becomes the close-state.

$$VG4=(Io/C1)\times t=(I/C1)\times t \quad (4)$$

Next, when the gate voltage of the output transistor MPout increases and reaches the lower range value VL of the output terminal voltage transition range at timing T15, the voltage of the output terminal starts to decrease. Then, when the gate voltage of the output transistor MPout reaches the upper range value VH of the output terminal voltage transition range at timing T16, the voltage of the output terminal turns to Low level, and the voltage change of the output terminal is completed. That is, the voltage of the output terminal remains unchanged over the period from the timing T14 to the timing T15, and changes over the period from the timing T15 to the timing T16. The period from the timing T14 to the timing T15 is defined as the delay time Tpd4 between the output signal and the input signal. Meanwhile, the period from the timing T15 to the timing T16 is defined as a rising time Tf2 of the output signal.

As explained above, the output circuit 2 in accordance with the second embodiment, likewise, controls the current control circuit 10 and the switch circuit S2 based on the input signal. Accordingly, the output circuit 2, likewise, can improve tolerance to noise transmitted from the output terminal. Furthermore, even if a PMOS transistor is used as the output transistor, the output circuit 2 can still make the duty ratio of an output signal precisely conform to the duty ratio of the input signal in similar manner to the output circuit 1 in accordance with the first embodiment by using PMOS transistors as the transistors constituting the switch circuit S1 and voltage generating circuit 12.

Third Embodiment

Third to sixth embodiments are the variations of the current control circuit 10 of the output circuit 1 in the first embodiment. In these variations, the current outflow and inflow for the gate of the output transistor MNout are performed without the direct intervention of the first current control switch S11 and second current control switch S12 of the current control circuit 10. With these structures, it becomes insensitive to the on-resistance of the first current control switch S11 and second current control switch S12, and thereby the gate voltage of the output transistor MNout can be controlled more accurately than in the output circuit 1 in the following embodiments.

Figure 5:
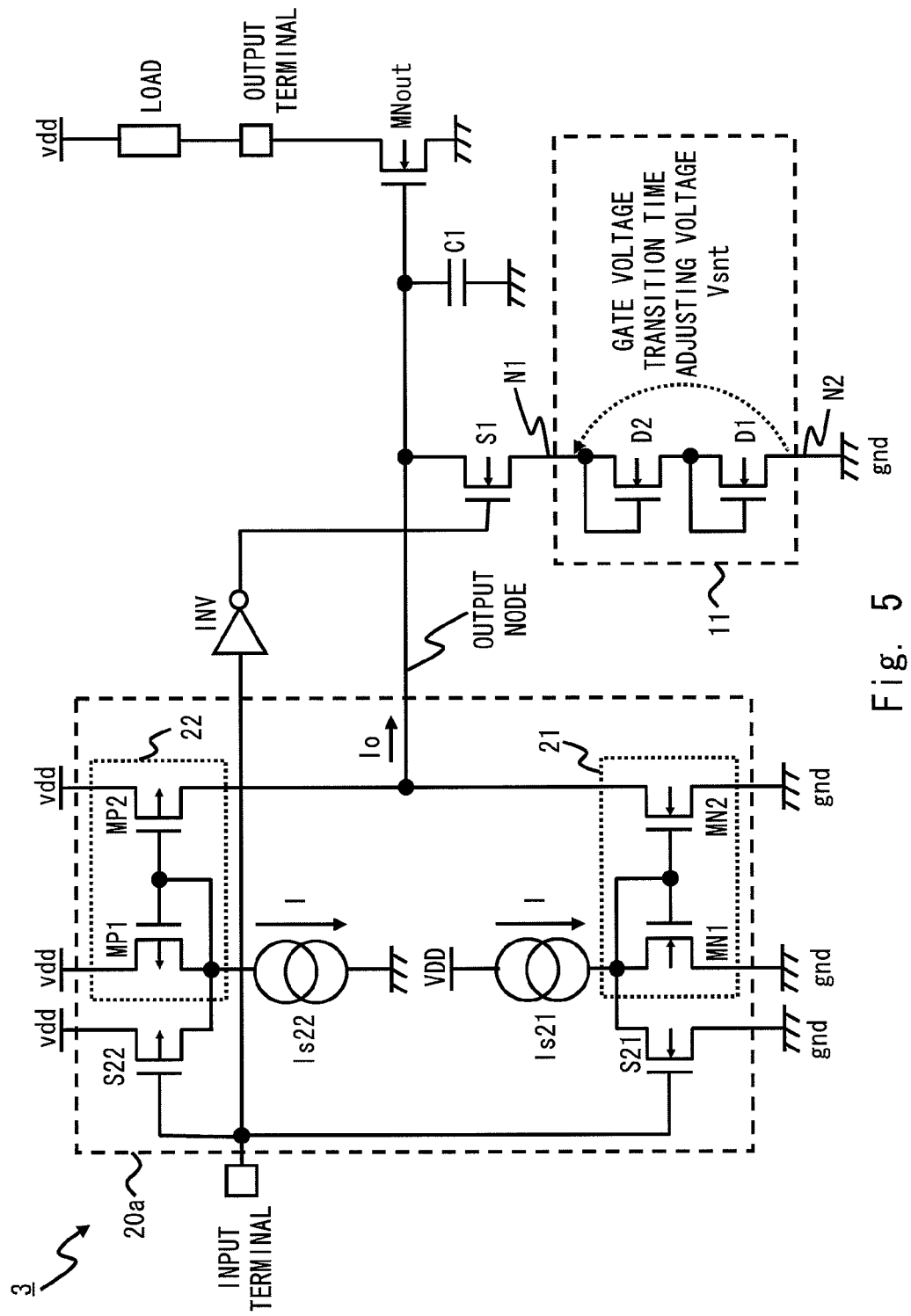
FIG. 5 is a circuit diagram of an output circuit in accordance with a third embodiment of the present invention.

FIG. 5 shows a circuit diagram of an output circuit 3 in accordance with a third embodiment of the present invention. As shown in FIG. 5, the output circuit includes a current control circuit 20 as substitute for the current control circuit 10 of the output circuit 1. The current control circuit 20a includes a first current mirror 21, a second current mirror 22, a first current source Is21, a second current source Is22, a first current control switch S21, and a second current control switch S22. Incidentally, both the first current source Is21 and second current source Is22 have the same current value I in the current control circuit 20a.

The first current mirror 21 includes NMOS transistors MN1 and MN2 which constitute a current mirror circuit. The source of the NMOS transistor MN1 is connected to the ground wiring gnd and the drain is connected to the output terminal through the first current source Is21. Furthermore, the drain and the gate of the NMOS transistor MN1 are connected with each other. The source of the NMOS transistor MN2 is connected to the ground wiring gnd and the drain is connected to the gate of output transistor MNout. Furthermore, the gate of the NMOS transistor MN2 is connected to the common node to the gate of the NMOS transistor MN1.

The second current mirror 22 includes PMOS transistors MP1 and MP2 which constitute a current mirror circuit. The source of the PMOS transistor MP1 is connected to the power supply wiring vdd and the drain is connected to the ground wiring gnd through the second current source Is22. Furthermore, the drain and the gate of the PMOS transistor MP1 are connected with each other. The source of the PMOS transistor MP2 is connected to the power supply wiring vdd and the drain is connected to the gate of output transistor MNout. Furthermore, the gate of the PMOS transistor MP2 is connected to the common node to the gate of the PMOS transistor MP1.

The first current control switch S21 is composed of a NMOS transistor. The first current control switch S21 is connected in parallel to the NMOS transistor MN1, and the gate of the first current control switch S21 is connected to the input terminal. Meanwhile, the second current control switch S22 is composed of a PMOS transistor. The second current control switch S22 is connected in parallel to the PMOS transistor MP1, and the gate of the second current control switch S22 is connected to the input terminal.

Furthermore, the gate of the switch circuit S1 is connected to the input terminal through an inverter INV in the output circuit 3 in order to modify the logical operation of the switch circuit S1 in accord with the operation of the current control circuit 20a.

When the input signal is at High level, the current control circuit 20a brings the first current control switch S21 to the close-state, and stops the operation of the first current mirror 21. It also brings the second current control switch S22 to the open-state, and starts the operation of the second current mirror 22. In this manner, the current control circuit 20a pours out the current I outputted from the second current source Is22. At this point, since Low level is supplied as the input signal to the switch circuit S1, it becomes the open-state.

On the other hand, when the input signal is at Low level, the current control circuit 20a brings the first current control switch S21 to the open-state, and starts the operation of the first current mirror 21. It also brings the second current control switch S22 to the close-state, and stops the operation of the second current mirror 22. In this manner, the current control circuit 20a draws in the current I outputted from the first current source Is21. At this point, since High level is supplied as the input signal to the switch circuit S1, it becomes the close-state.

Fourth Embodiment

Figure 6:
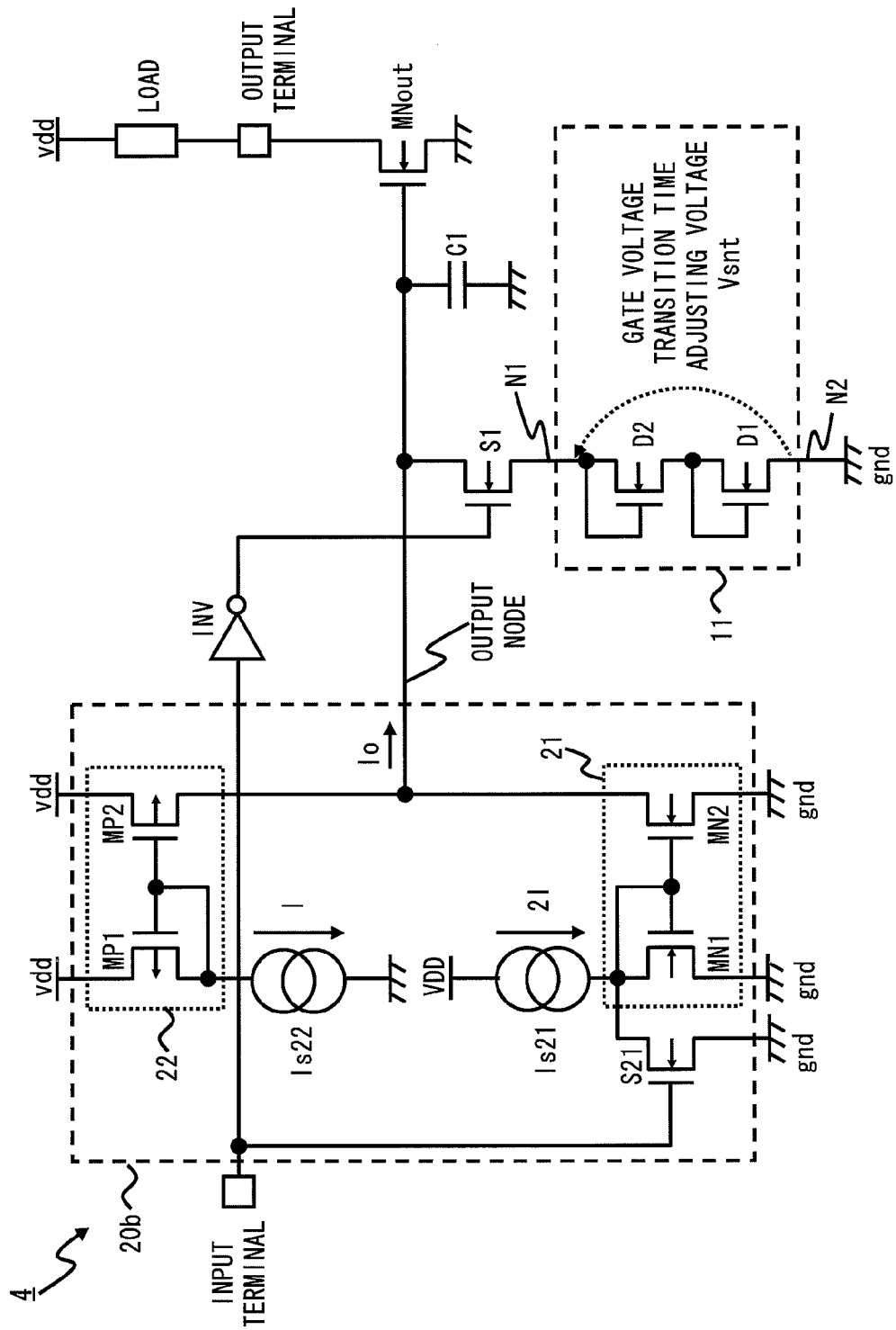
FIG. 6 is a circuit diagram of an output circuit in accordance with a forth embodiment of the present invention.

FIG. 6 shows a circuit diagram of an output circuit 4 in accordance with a forth embodiment of the present invention. As shown in FIG. 6, the output circuit 4 includes a current control circuit 20b which is the identical to the current control circuit 20a of the output circuit 3 in accordance with the third embodiment except that it does not have the second current control switch S22. Furthermore, the first current source Is21 produces current twice as large as the current produced by the second current source Is22.

When the input signal is at High level, the current control circuit 20b brings the first current control switch S21 to the close-state, and stops the operation of the first current mirror 21. In this manner, the current control circuit 20b pours out the current I outputted from the second current source Is22. At this point, since Low level is supplied as the input signal to the switch circuit S1, it becomes the open-state.

On the other hand, when the input signal is at Low level, the current control circuit 20b brings the first current control switch S21 to the open-state, and starts the operation of the first current mirror 21. In this manner, the current control circuit 20b draws in the current I based on the difference between the current 2I outputted from the first current source Is21 and the current I outputted from the second current source Is22. At this point, since High level is supplied as the input signal to the switch circuit S1, it becomes the close-state.

Fifth Embodiment

Figure 7:
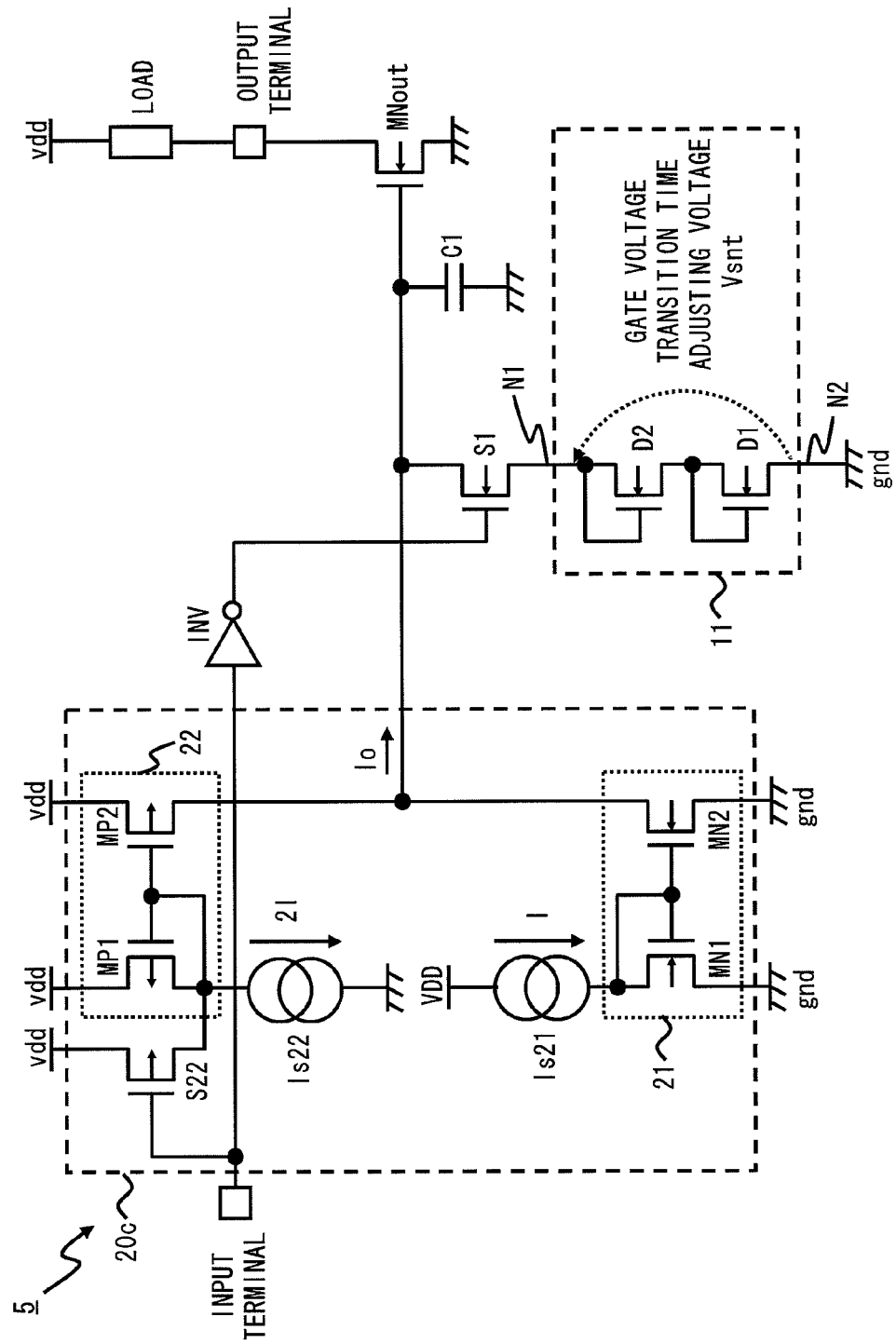
FIG. 7 is a circuit diagram of an output circuit in accordance with a fifth embodiment of the present invention.

FIG. 7 shows a circuit diagram of an output circuit 5 in accordance with a fifth embodiment of the present invention. As shown in FIG. 7, the output circuit 5 includes a current control circuit 20c which is the identical to the current control circuit 20a of the output circuit 3 in accordance with the third embodiment except that it does not have the first current control switch S21. Furthermore, the second current source Is22 produces current twice as large as the current produced by the first current source Is21.

When the input signal is at High level, the current control circuit 20c brings the second current control switch S22 to the open-state, and starts the operation of the first current mirror 21. In this manner, the current control circuit 20c pours out the current I based on the difference between the current 2I outputted from the second current source Is22 and the current I outputted from the first current source Is21. At this point, since Low level is supplied as the input signal to the switch circuit S1, it becomes the open-state.

On the other hand, when the input signal is at Low level, the current control circuit 20c brings the second current control switch S22 to the close-state, and stops the operation of the first current mirror 21. In this manner, the current control circuit 20c draws in the current I outputted from the first current source Is21. At this point, since High level is supplied as the input signal to the switch circuit S1, it becomes the close-state.

Sixth Embodiment

Figure 8:
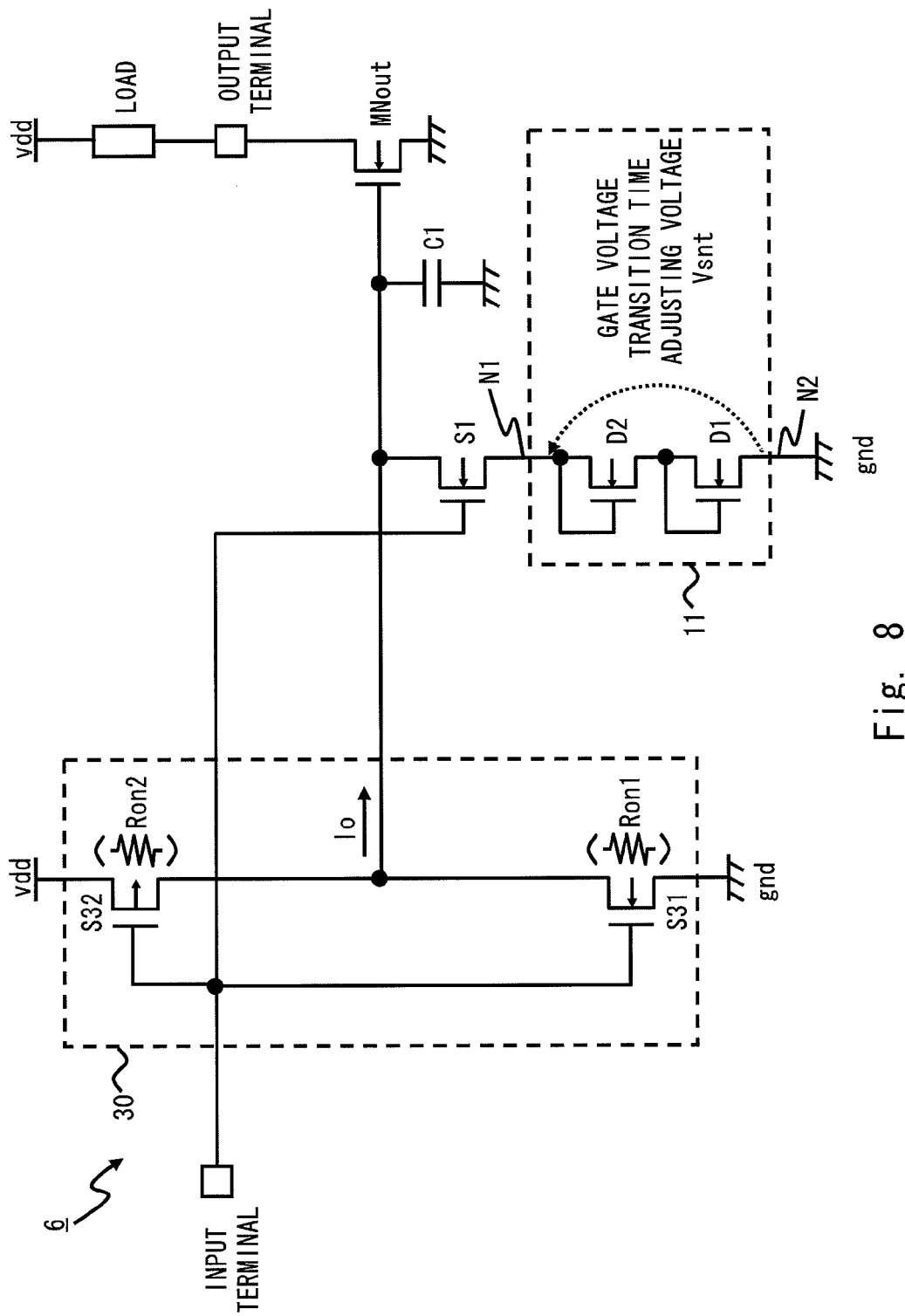
FIG. 8 is a circuit diagram of an output circuit in accordance with a sixth embodiment of the present invention.
Figure 9:
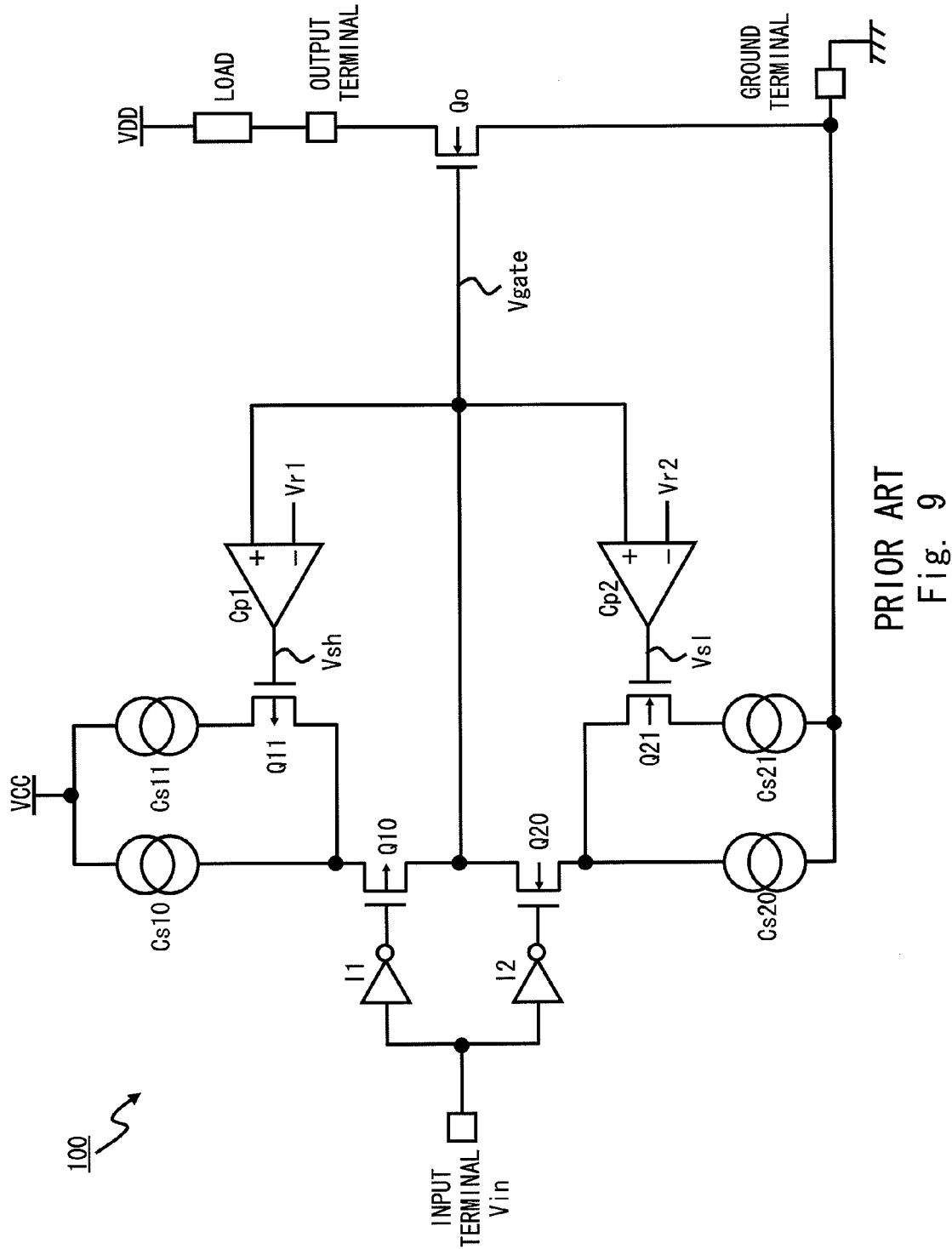
FIG. 9 is a circuit diagram of an output circuit in accordance with related art.

FIG. 8 shows a circuit diagram of an output circuit 6 in accordance with a sixth embodiment of the present invention. As shown in FIG. 8, the output circuit 6 includes a current control circuit 30 composed of a first current control switch S31 and a second current control switch S32. The first current control switch S31 is a NMOS transistor connected between the ground wiring gnd and the gate of the output transistor MNout. The gate of the first current control switch S31 is connected to the input terminal. The second current control switch S32 is a PMOS transistor connected between the power supply wiring vdd and the gate of the output transistor MNout. The gate of the second current control switch S32 is connected to the input terminal. Incidentally, the first current control switch S31 and second current control switch S32 are controlled in the same manner as the first current control switch S11 and second current control switch S12 of the first embodiment.

Furthermore, the output current value is established by the on-resistance of the first current control switch S31 and second current control switch S32 in the current control circuit 30. This on-resistance is established by adjusting at least one of the gate length and gate width of the transistors constituting the first current control switch S31 and second current control switch S32. For example, the shorter the gate length, the smaller the on-resistance becomes, and the narrower the gate width, the larger the on-resistance becomes Then, the smaller the on-resistance, the larger the output current becomes, and the larger the on-resistance, the smaller the output current becomes. By adjusting the output current with the first current control switch S31 and second current control switch S32 in this manner, it allows smaller circuits in scale.

It is apparent that the present invention is not limited to the above embodiments, but may be modified and changed without departing from the scope and spirit of the invention. For example, although the introduction of the capacitor C1 allows more accurate control of the gate voltage of the output transistor, the capacitor C1 can be eliminated in some cases where the variation of the parasitic gate capacitances between output transistors is small.

What is claimed is:

1. An output circuit comprising:
an input terminal receiving an input signal;
an output transistor connected between a first power supply and an output terminal;

a current control circuit connected to the input terminal and the output transistor for controlling current outflow and inflow for the gate of the output transistor based on the input signal;
a voltage generating circuit connected to the first power supply; and
a switch circuit coupled between the gate of the output transistor and the voltage generating circuit, the switch circuit having alternatively an on state and an off state thereof in response to the input signal;
wherein the switch circuit becomes the off state when the potential difference between the gate of the output transistor and the first power supply becomes equal to or below a predetermine value regardless of the voltage level of the input signal.

2. The output circuit of claim 1 wherein the switch circuit comprises a source connected to the voltage generating circuit and a drain connected to the gate of the output transistor, and the voltage generating circuit establishes the voltage difference between the source and the first power supply.

3. The output circuit of claim 1 wherein the voltage generating circuit establishes the voltage difference between the gate of the output transistor and the first power supply by a plurality of serially connected diodes, at which voltage difference the switch circuit becomes the off state.

4. The output circuit of claim 3 wherein the output transistor is composed of a NMOS transistor, each of the diodes is composed of a diode-connected NMOS transistor, and the anode of the diodes is connected on the side of the gate of the output transistor and the cathode of the diodes is connected on the side of the first power supply.

5. The output circuit of claim 3 wherein the output transistor is composed of a PMOS transistor, each of the diodes is composed of a diode-connected PMOS transistor, and the cathode of the diodes is connected on the side of the gate of the output transistor and the anode of the diodes is connected on the side of the first power supply.

6. The output circuit of claim 1 wherein the voltage difference established by the voltage generating circuit is determined by the threshold voltage of the output transistor and the transconductance of the output transistor.

7. The output circuit of claim 1 wherein the current control circuit controls such that the current value at the outflow stage and the current value at the inflow stage are substantially the same.

8. The output circuit of claim 1 further comprising a capacitor connected between the gate of the output transistor and the first power supply or the second power supply.

9. The output circuit of claim 1 wherein:
the current control circuit comprises:
 a first current source and a first current control switch connected in series between the first power supply and the gate of the output transistor; and
 a second current source and a second current control switch connected in series between the second power supply and the gate of the output transistor; and
the on state and the off state of the first and second current control switches are controlled based on the input signal.

10. The output circuit of claim 1 wherein the current control circuit comprises:
a first current source for establishing current value on the inflow side of the current control circuit;
a first current mirror for drawing in current for the gate of the output transistor based on the current outputted from the first current source;
a second current source for establishing current value on the outflow side of the current control circuit;
a second current mirror for pouring out current for the gate of the output transistor based on the current outputted from the second current source;
a first current control switch coupled between the gate of the transistor constituting the first current mirror and the first power supply, the first current control switch having alternatively an on state and an off state thereof in response to the input signal; and
a second current control switch coupled between the gate of the transistor constituting the second current mirror and the second power supply, the second current control switch having alternatively an on state and an off state thereof in response to the input signal.

11. The output circuit of claim 1 wherein the current control circuit comprises:
a first current source for establishing current value on the inflow side of the current control circuit;
a first current mirror for drawing in current for the gate of the output transistor based on the current outputted from the first current source;
a second current source for establishing current value on the outflow side of the current control circuit;
a second current mirror for pouring out current for the gate of the output transistor based on the current outputted from the second current source; and
a first current control switch coupled between the gate of the transistor constituting the first current mirror and the first power supply, the first current control switch having alternatively an on state and an off state thereof in response to the input signal.

12. The output circuit of claim 1 wherein the current control circuit comprises:
a first current source for establishing current value on the inflow side of the current control circuit;
a first current mirror for drawing in current for the gate of the output transistor based on the current outputted from the first current source;
a second current source for establishing current value on the outflow side of the current control circuit;
a second current mirror for pouring out current for the gate of the output transistor based on the current outputted from the second current source; and
a second current control switch coupled between the gate of the transistor constituting the second current mirror and the second power supply, the second current control switch having alternatively an on state and an off state thereof in response to the input signal.

13. The output circuit of claim 1 wherein:
the current control circuit comprises:
 a first transistor connected between the gate of the output transistor and the first power supply, the conductivity state of the first transistor being controlled based on the input signal; and
 a second transistor connected between the gate of the output transistor and the second power supply, the conductivity state of the second transistor being controlled based on the input signal; and
the first and second transistors controls the current value drawn in or poured out for the gate of the output transistor based on the value of the on-resistance.

* * * * *